United States Patent
Cheng et al.

(10) Patent No.: US 11,239,342 B2
(45) Date of Patent: Feb. 1, 2022

(54) VERTICAL TRANSISTORS HAVING IMPROVED CONTROL OF TOP SOURCE OR DRAIN JUNCTIONS

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 67 days.

(21) Appl. No.: 16/022,187

(22) Filed: Jun. 28, 2018

(65) Prior Publication Data
US 2020/0006528 A1     Jan. 2, 2020

(51) Int. Cl.
| H01L 29/66  | (2006.01) |
| H01L 21/225 | (2006.01) |
| H01L 29/10  | (2006.01) |
| H01L 21/02  | (2006.01) |
| H01L 29/78  | (2006.01) |

(Continued)

(52) U.S. Cl.
CPC .. *H01L 29/66666* (2013.01); *H01L 21/02576* (2013.01); *H01L 21/02579* (2013.01); *H01L 21/2254* (2013.01); *H01L 29/0847* (2013.01); *H01L 29/1037* (2013.01); *H01L 29/6656* (2013.01); *H01L 29/7827* (2013.01); *H01L 21/324* (2013.01); *H01L 21/3212* (2013.01)

(58) Field of Classification Search
CPC ....... H01L 29/66666; H01L 21/823885; H01L 21/02576; H01L 21/02579; H01L 21/2254; H01L 29/0847; H01L 29/1037; H01L 29/6656; H01L 29/7827; H01L 21/3212; H01L 21/324; H01L 21/02532; H01L 21/0262
See application file for complete search history.

(56) References Cited

U.S. PATENT DOCUMENTS

| 5,087,576 A | * | 2/1992 | Edmond | ............... H01L 21/046 |
| | | | | 257/E21.057 |
| 6,027,975 A | | 2/2000 | Hergenrother et al. | |

(Continued)

OTHER PUBLICATIONS

List of IBM Patents or Patent Applications Treated as Related; Date Filed: Mar. 10, 2020, 2 pages.

*Primary Examiner* — Ajay Arora
*Assistant Examiner* — Laura M Dykes
(74) *Attorney, Agent, or Firm* — Cantor Colburn LLP; Joseph Petrokaitis

(57) ABSTRACT

Embodiments of the invention are directed to a method of forming a semiconductor device. A non-limiting example of the method includes forming a channel fin over a substrate and forming a top spacer region around a top portion of the channel fin, wherein the top spacer region includes a dopant. A dopant drive-in process is applied, wherein the dopant drive-in process is configured to drive the dopant from the top spacer region into the top portion of the channel fin to create a doped top portion of the channel fin and a top junction between the doped top portion of the channel fin and a main body portion of the channel fin.

16 Claims, 3 Drawing Sheets

(51) Int. Cl.
  *H01L 29/08*    (2006.01)
  *H01L 21/324*    (2006.01)
  *H01L 21/321*    (2006.01)

(56) References Cited

U.S. PATENT DOCUMENTS

| | | |
|---|---|---|
| 6,690,040 B2 | 2/2004 | Chaudhry et al. |
| 6,709,904 B2 | 3/2004 | Chaudhry et al. |
| 6,773,994 B2 | 8/2004 | Chittipeddi et al. |
| 7,033,877 B2 | 4/2006 | Chaudhry et al. |
| 7,176,089 B2 | 2/2007 | Furukawa et al. |
| 8,569,182 B2 | 10/2013 | Park et al. |
| 8,704,291 B2 | 4/2014 | Inagawa et al. |
| 9,312,383 B1 * | 4/2016 | Cheng ............... H01L 21/84 |
| 9,530,866 B1 | 12/2016 | Zhang et al. |
| 9,536,793 B1 | 1/2017 | Zhang et al. |
| 9,640,636 B1 * | 5/2017 | Bentley ............ H01L 29/66666 |
| 9,647,123 B1 | 5/2017 | Balakrishnan et al. |
| 9,773,708 B1 | 9/2017 | Zhang et al. |
| 9,935,018 B1 * | 4/2018 | Xie ............... H01L 21/823885 |
| 9,954,109 B2 * | 4/2018 | Cheng ............... H01L 29/7827 |
| 10,388,795 B2 * | 8/2019 | Cheng ............... H01L 29/7827 |
| 2003/0052365 A1 | 3/2003 | Chaudhry et al. |
| 2005/0112817 A1 | 5/2005 | Cheng et al. |
| 2011/0147842 A1 | 6/2011 | Cappellani et al. |
| 2015/0011066 A1 | 1/2015 | Mizokuchi et al. |
| 2015/0179763 A1 | 6/2015 | Inagawa et al. |
| 2016/0293756 A1 | 10/2016 | Liu et al. |
| 2016/0300857 A1 | 10/2016 | Liu et al. |
| 2017/0179116 A1 | 6/2017 | Anderson et al. |
| 2017/0323977 A1 * | 11/2017 | Cheng ............... H01L 29/7827 |
| 2017/0330878 A1 * | 11/2017 | Pandey ............... H01L 29/518 |
| 2018/0012993 A1 | 1/2018 | Cheng et al. |
| 2018/0019337 A1 | 1/2018 | Xie et al. |
| 2018/0175212 A1 | 6/2018 | Cheng et al. |
| 2020/0052094 A1 * | 2/2020 | Mochizuki ...... H01L 21/823418 |
| 2020/0328127 A1 * | 10/2020 | Yamashita ...... H01L 21/823814 |

\* cited by examiner

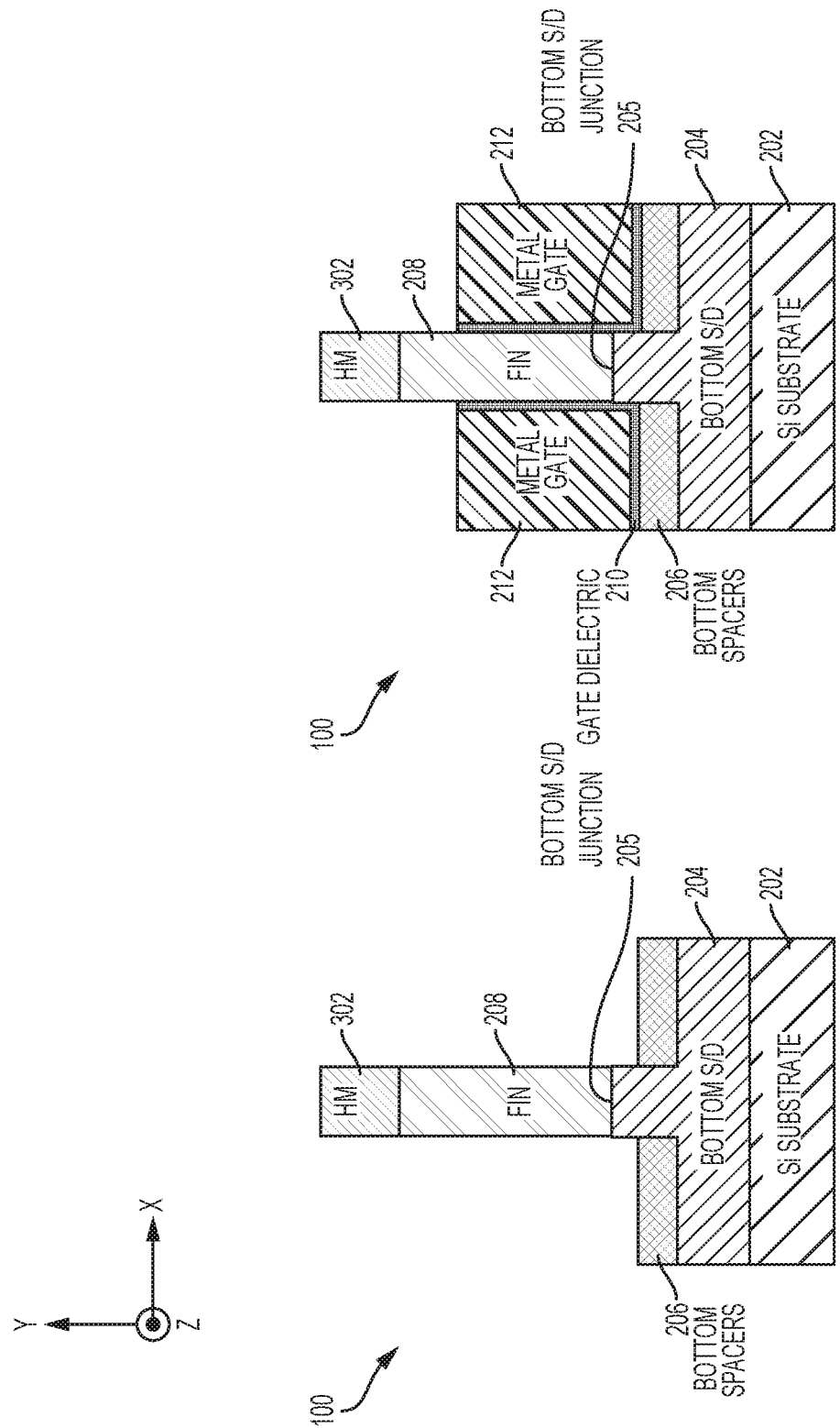

VERTICAL TRANSISTORS HAVING IMPROVED CONTROL OF TOP SOURCE OR DRAIN JUNCTIONS

BACKGROUND

The present invention relates in general to semiconductor devices and their fabrication. More specifically, the present invention relates to improved fabrication methodologies and resulting structures for vertical field effect transistors (VFETs) configured and arranged to provide improved control over the formation of top source/drain (S/D) junctions.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSTFETs is known as a planar device geometry in which the various parts of the MOSFET device are laid down as planes or layers.

A type of MOSFET is a non-planar FET known generally as a VFET. VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the invention are directed to a method of forming a semiconductor device. A non-limiting example of the method includes forming a channel fin over a substrate and forming a top spacer region around a top portion of the channel fin, wherein the top spacer region includes a dopant. A dopant drive-in process is applied, wherein the dopant drive-in process is configured to drive the dopant from the top spacer region into the top portion of the channel fin to create a doped top portion of the channel fin and a top junction between the doped top portion of the channel fin and a main body portion of the channel fin.

Embodiments of the invention are directed to a semiconductor device. A non-limiting example of the semiconductor device includes a channel fin formed over a substrate and a doped top spacer region around a doped top portion of the channel fin. The doped top portion of the channel fin includes top portion dopants that were driven into the top portion of the channel fin from the doped top spacer region. The top portion dopants create a top junction between the doped top portion of the channel fin and a main body portion of the channel fin.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 1-5 depict cross-sectional views of a semiconductor structure after fabrication operations of a method for forming a final VFET semiconductor device having improved control over the top S/D junction in accordance with aspects of the invention, in which:

FIG. 1 depicts a cross-sectional view of the semiconductor structure after fabrication operations according to embodiments of the invention;

FIG. 2 depicts a cross-sectional view of the semiconductor structure after fabrication operations according to embodiments of the invention;

FIG. 3 depicts a cross-sectional view of the semiconductor structure after fabrication operations according to embodiments of the invention;

FIG. 4 depicts a cross-sectional view of the semiconductor structure after fabrication operations according to embodiments of the invention; and FIG. 5 depicts a cross-sectional view of the semiconductor device after fabrication operations to form the final VFET semiconductor device having improved control over the top S/D junction in accordance with embodiments of the invention.

Figures 3, 4:
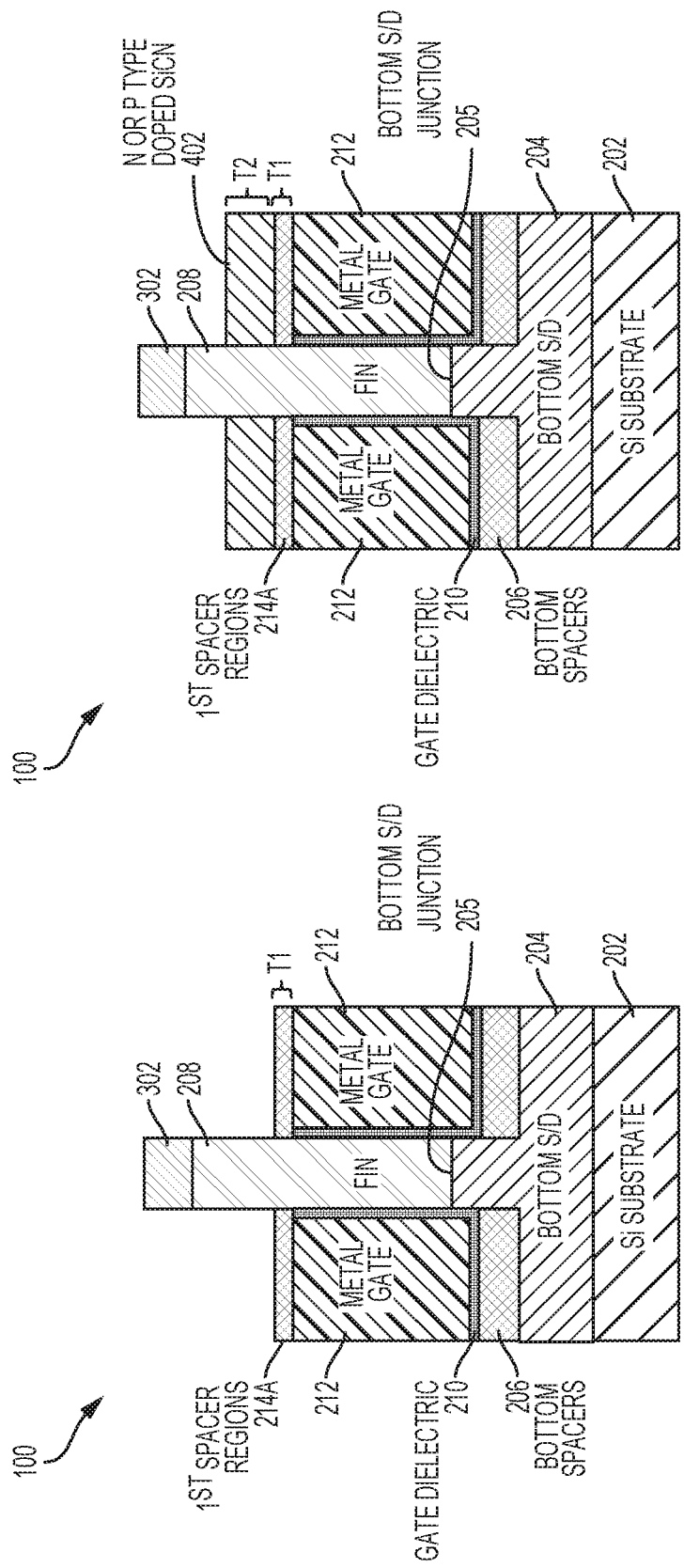

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. A bottom junction is formed at the interface between the channel fin and the bottom S/D region, and a top junction is formed at the interface between the channel fin and the tope S/D region. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

If the gate does not sufficiently laterally overlap the top and bottom S/D junctions, external resistance is increased and overall transistor performance is degraded. In known VFET fabrication operations, the fin is recessed, and the top S/D region is formed on the recessed fin using an in-situ doped epitaxial growth process. The fin must be recessed to a sufficient depth that the top S/D junction laterally overlaps the gate. The gate dielectric is exposed to the etchant used to recess the fin, which can cause potential thinning of the gate dielectric and contamination of the epitaxy tool. If the fin recessed is limited to limit damage to the gate dielectric, the fin will not be recessed to a sufficient depth, and the top S/D junction will laterally underlap the gate, which increases external resistance and degrades overall transistor performance.

Turning now to an overview of aspects of the invention, embodiments of the invention provide improved fabrication methodologies and resulting structures for VFETs having improved control over the formation of the top source/drain (S/D) junction. In embodiments of the invention, the fin is not recessed, and the top S/D junction is formed by forming at least a portion of the top spacer as a doped dielectric material. If the VFET is n-type, the doped dielectric material will be doped with n-type dopants such as As or P. If the VFET is p-type, the doped dielectric material will be doped with p-type dopants such as B. A dopant drive-in process is applied at a temperature and for a duration that are sufficient to drive dopants from the doped dielectric material into a top portion of the fin. In embodiments of the invention, the drive in temperature can be about 950 Celsius degrees. The dopants spread/diffuse laterally across the top portion of the fin and downward into the fin, thereby converting the top portion of the fin to an initial top S/D region that forms the top S/D junction. The thickness of the doped dielectric material, the temperature of the dopant drive-in, and the duration of the dopant drive-in are tuned to position the top S/D junction at a desired location and ensure that the top S/D junction extends deep enough into the fin to overlap the gate in a lateral direction. In other words, in a lateral direction, the top S/D junction is adjacent to some portion of the gate. The initial top S/D is extended to the desired final top S/D region by epitaxially growing in-situ doped S/D material from the initial S/D region. Because there is no need to recess the fin, the gate dielectric is not exposed to etchant, and there is no thinning of the gate dielectric and contamination of the epitaxy tool. Improved control over the location of the top S/D junction is provided because the location of the top S/D junction can be tuned by tuning/selecting the thickness of the doped dielectric material, the temperature of the dopant drive-in, and the duration of the dopant drive-in to ensure that the top S/D junction extends deep enough into the fin to laterally overlap the gate.

Turning now to a more detailed description of embodiments of the invention, FIGS. 1-5 depict two-dimensional (2D) cross-sectional views of a semiconductor structure 100 after fabrication operations according to embodiments of the invention. The fabrication operations depicted in FIGS. 1-5 are applied to the semiconductor structure 100 to form the final VFET device 100A shown in FIG. 5. As shown in FIG. 1, known semiconductor fabrication operations have been used to form the semiconductor structure 300 having a substrate 202, a bottom S/D region 204 across from a major surface of a substrate 202, a channel fin 208, a hard mask 302, and a bottom spacer 206, configured and arranged as shown. With reference to the X/Y/Z diagram depicted in FIG. 1, the various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted in the 2D cross-sectional views shown in FIGS. 1-5, the various elements that form the semiconductor structure 100 and/or the final VFET device 100A (shown in FIG. 5) also extend along a third axis (e.g., Z-axis) perpendicular to the first axis and the second axis to define depth dimensions. In accordance with standard VFET architectures, various elements of the semiconductor structures 100 and the VFET 100A (e.g., bottom spacer 206, gate dielectric 210, gate structure 212, etc.) extend completely around the sidewalls of the channel fin 208 in the X, Y, and Z directions.

The substrate 202 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 202 includes a buried oxide layer (not depicted). In some embodiments of the invention, the bottom S/D region 204 can be formed later in the fabrication process. In some embodiments of the invention, the bottom S/D region 204 is epitaxially grown, and the necessary doping to form the bottom S/D region 204 is provided through in-situ doping during the epitaxial growth process, or through ion implantation after the bottom S/D region 204 is formed. The bottom S/D region 204 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ and $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Continuing with FIG. 1, the channel fin 208 can be formed prior to formation of the bottom spacers 206 by depositing an undoped semiconductor (e.g., Si) region (not shown) 302 across from the doped bottom S/D region 204. The semiconductor region is a precursor to the channel fin 208. In some embodiments of the invention, the undoped semiconductor region is epitaxially grown. If needed, dopants can be intentionally added to the deposited semiconductor region. In the embodiments of the invention depicted in FIG. 1, the bottom portion of the semiconductor region is doped sufficiently to form an extension of the bottom S/D region 204 into the bottom portion of the fin 208 to form a bottom S/D junction edge 205. For the portion of the semiconductor region that will form the main body of the channel fin 208, if dopants are added to the semiconductor region, the added dopant concentration is lower than the dopant concentration in the bottom S/D region 204. A hard mask layer (not shown) is deposited across from the undoped semiconductor region (i.e., the precursor to the channel fin 208) using any suitable deposition process. For example, the hard mask layer can be a dielectric such as silicon nitride (SiN), silicon oxide, or a combination of silicon oxide and silicon nitride. Conventional semiconductor device fabrication processes (e.g., patterning and lithography, self-aligned double patterning, self-aligned quadruple patterning) are used to remove portions of the undoped semiconductor region and the hard mask layer to form the channel fin 208 and the hard mask 302. In some embodiments of the invention, the hard mask layer is patterned to expose portions of the undoped semiconductor region. The exposed portions of the semiconductor region can then be removed or recessed using, for example, a wet etch, a dry etch, or a combination thereof, to thereby form the channel fin 208 and the hard mask 302. The channel fin 208 can be electrically isolated from other regions of the substrate 202 by a shallow trench isolation (not depicted). The shallow trench isolation can be of any suitable dielectric material, such as, for example, a silicon oxide.

Bottom spacers 206 are formed across from the doped S/D region 204 and adjacent to a bottom portion of the channel fin 208. The bottom spacers 206 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacers 208 can be formed using known deposition processes, such as, for example, CVD, PECVD, ALD, PVD, chemical solution deposition, or other like processes.

In FIG. 2, a gate dielectric 210 and a gate conductor/metal 212 (e.g., a work function metal (WFM)) have been deposited over the bottom spacer 206 and adjacent to a portion of the channel fin 208. In embodiments of the invention, the gate conductor 212 can be formed by overfilling a gate conductor material above a top surface of the hard mask 302 and planarizing the gate conductor material to a level below the top surface of the channel fine 208 using, for example, CMP.

The gate dielectric 210 can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, atomic layer deposition (ALD), evaporation, physical vapor deposition (PVD), chemical solution deposition, or other like processes. The thickness of the gate dielectric films can vary depending on the deposition process as well as the composition and number of high-k dielectric materials used.

The gate conductor 212 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the gate conductor 212 can be a WFM deposited over the gate dielectric films 210 by a suitable deposition process, for example, CVD, PECVD, PVD, plating, thermal or e-beam evaporation, and sputtering. The type of WFM depends on the type of transistor and can differ between the nFET and pFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The gate conductor 212 can further include a tungsten (W), titanium (Ti), aluminum (Al), cobalt (Co), or nickel (Ni) material over the WFM layer of the gate conductor 212. The gate conductor 212 can be deposited by a suitable deposition process, for example, CVD, PECVD, PVD, plating, thermal or e-beam evaporation, and sputtering.

In FIG. 3, a first top spacer region 214A has been formed over the gate 212 and the gate dielectric 210 and adjacent to a top portion of the channel fin 208. The first top spacer region 214A is formed to the thickness dimension T1 and can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The first top spacer region 214A can be formed using known deposition processes, such as, for example, CVD, PECVD, ALD, PVD, chemical solution deposition, other directional deposition techniques, or other like processes.

In FIG. 4, a second top spacer layer 402 has been formed over the first top spacer region 214A and adjacent to a top portion of the channel fin 208. The second top spacer region 214A is formed to the thickness dimension T2 and can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. In embodiments of the invention, the second top spacer region 402 can be formed from the same or a different material than the first top spacer region 214A. The second top spacer region 402 can be formed using known deposition processes, such as, for example, CVD, PECVD, ALD, PVD, chemical solution deposition, other directional deposition techniques, or other like processes.

In accordance with aspects of the invention, the second top spacer region 402 is a doped dielectric material. If the final VFET 100A (shown in FIG. 5) is n-type, the doped dielectric material will be doped with n-type dopants such as As or P. If the final VFET 100A is p-type, the doped dielectric material will be doped with p-type dopants such as B. Doping is added to the dielectric material of the second top spacer 402 in any suitable manner, including, for example, through in-situ doping during the deposition process, or an implantation technique applied after the second top spacer 402 is formed. Suitable doping techniques can include, for example, ion implantation, gas phase doping, plasma doping, plasma immersion ion implantation, cluster doping, infusion doping, liquid phase doping, solid phase doping, or any suitable combination of those techniques.

Figure 5:
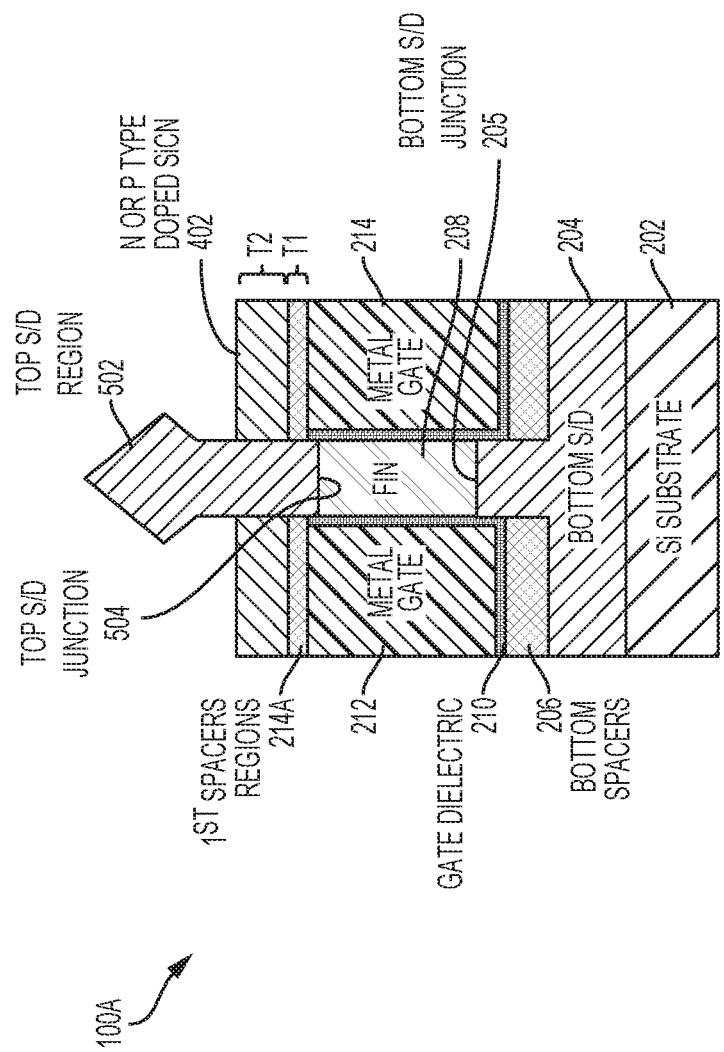

In FIG. 5, a RIE or equivalent process has been applied in order to remove the second hard mask 302. A dopant drive-in process was then applied at a temperature of about 950 Celsius degrees to drive dopants from the second top spacer 402 into a top portion of the fin 208. The dopants spread/diffuse laterally across the top portion of the fin 208 and downward into the fin 208, thereby converting the top portion of the fin 208 to an initial top S/D region that forms the top S/D junction 504. The thickness T2 of the second top spacer 402, the temperature of the dopant drive-in, and the duration of the dopant drive-in are tuned to ensure that the top S/D junction 504 extends deep enough into the fin 208 to laterally overlap the gate 212. In other words, in the lateral direction, the top S/D junction is across from or adjacent to a portion of the gate 212. The top S/D region 502 is formed by epitaxially growing in-situ doped S/D material from the initial S/D region. Because there is no need to recess the fin 208, the gate dielectric 210 is not exposed to etchant, and there is no thinning of the gate dielectric 210 and contamination of the epitaxy tool (not shown). Improved control over the location of the top S/D junction 504 is provided because the location of the top S/D junction 504 can be tuned by tuning/selecting the thickness T2 of the second top spacer 402, the temperature of the dopant drive-in, and the duration of the dopant drive-in to ensure that the top S/D junction 504 extends deep enough into the fin 208 to laterally overlap the gate 212. The thermal budget after formation of the top S/D region 502 can also impact the location of the top S/D junction 504. Accordingly, in embodiments of the invention, the impact of this thermal budget is also used to tune the location of the top S/D junction 504 to have the desired lateral overlap between the top S/D junction 504 and the gate 212.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a channel fin over a substrate, the channel fin configured to conduct current between a top doped source or drain (S/D) region and a bottom doped S/D region, the channel fin having a top portion comprising a channel fin semiconductor material, wherein the top portion of the channel fin comprises a first portion of the channel fin semiconductor material and a second portion of the channel fin semiconductor material;
    forming a top spacer region around sidewalls of the first portion of the top portion of the channel fin while leaving sidewalls of the second portion of the top portion of the channel fin exposed, wherein the top spacer region comprises a dopant; and
    forming a first portion of the top doped source or drain (S/D) region by applying a dopant drive-in process, wherein the dopant drive-in process is configured to drive the dopant, while the sidewalls of the second portion are exposed, from the top spacer region through the sidewalls of the first portion of the channel fin and into the first portion and the second portion of the top portion of the channel fin to create the first portion of the doped top S/D region and a top junction between the first portion of the top S/D region and a main body portion of the channel fin; and
    forming a second portion of the top doped S/D region by epitaxially growing the second portion of the top doped S/D region from exposed surfaces of the first portion of the top doped S/D region.

2. The method of claim 1 further comprising forming a gate structure across from the substrate and around a central portion of the channel fin.

3. The method of claim 2, wherein the gate structure laterally overlaps the top junction.

4. The method of claim 1, wherein the top spacer region comprises a low-k dielectric material.

5. The method of claim 1 wherein the location of the top junction is controlled based at least in part on a thickness dimension of the top spacer region.

6. The method of claim 5 wherein the location of the top junction is controlled based at least in part on a temperature of the dopant drive-in process.

7. The method of claim 6 wherein the location of the top junction is controlled based at least in part on a duration of the dopant drive-in process.

8. The method of claim 1, wherein the dopant comprises an n-type dopant.

9. The method of claim 1, wherein the dopant comprises a p-type dopant.

10. A semiconductor device comprising:
    a channel fin formed over a substrate, the channel fin configured to conduct current between a top doped source or drain (S/D) region and a bottom doped S/D region, the channel fin having a top portion comprising a channel fin semiconductor material, wherein the top portion of the channel fin comprises a first portion of the channel fin semiconductor material and a second portion of the channel fin semiconductor material;
    a top spacer region formed around sidewalls of the first portion of the top portion of the channel fin and not formed on sidewalls of the second portion of the top portion of the channel fin, wherein the top spacer region comprises a dopant;
    wherein a first portion of the top doped source or drain (S/D) region comprises top doped portion dopants that were driven, while the sidewalls of the second portion were exposed, from the top spacer region through the sidewalls of the first portion of the channel fin and into the first portion and the second portion of the top portion of the channel fin to create the first portion of the doped top S/D region and a top junction between the first portion of the top S/D region and a main body portion of the channel fin; and a second portion of the top doped S/D region epitaxially grown from the first portion of the top doped S/D region.

11. The device of claim 10 further comprising a gate structure formed across from the substrate and around a central portion of the channel fin.

12. The device of claim 11, wherein the gate structure laterally overlaps the top junction.

13. The device of claim 10, wherein the top spacer region comprises a low-k dielectric material.

14. The device of claim 10 wherein the location of the top junction is controlled based at least in part on a thickness dimension of the top spacer region.

15. The device of claim 14 wherein the location of the top junction is controlled based at least in part on a temperature of a dopant drive-in process used to drive dopants from the top spacer region through sidewalls of the first portion of the channel fin and into the first portion and the second portion of the top portion of the channel fin.

16. The device of claim 15 wherein the location of the top junction is controlled based at least in part on a duration of the dopant drive-in process.

* * * * *